(12) United States Patent
Lin et al.

(10) Patent No.: US 12,345,747 B2
(45) Date of Patent: Jul. 1, 2025

(54) IN MEMORY COMPUTING (IMC) MEMORY DEVICE AND METHOD

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 153 days.

(21) Appl. No.: 18/147,727

(22) Filed: Dec. 29, 2022

(65) Prior Publication Data

US 2024/0219437 A1    Jul. 4, 2024

(51) Int. Cl.
    *G01R 19/257*    (2006.01)
    *G01R 19/00*    (2006.01)

(52) U.S. Cl.
    CPC ....... *G01R 19/257* (2013.01); *G01R 19/0023* (2013.01)

(58) Field of Classification Search
    CPC .......................... G01R 19/257; G01R 19/0023
    See application file for complete search history.

(56) References Cited

U.S. PATENT DOCUMENTS

| | | | |
|---|---|---|---|
| 11,189,339 B1 | 11/2021 | Liu et al. | |
| 11,586,896 B2 | 2/2023 | Chettuvetty et al. | |
| 2020/0388330 A1* | 12/2020 | Grover | H10B 10/12 |
| 2022/0012016 A1* | 1/2022 | Wang | G06F 7/5443 |
| 2022/0028444 A1* | 1/2022 | Papageorgiou | G06N 3/08 |
| 2022/0334801 A1* | 10/2022 | Wang | G06F 7/5443 |
| 2023/0027768 A1* | 1/2023 | Chen | G06N 3/065 |
| 2023/0113627 A1* | 4/2023 | Kim | H10B 61/20 706/34 |
| 2024/0069867 A1* | 2/2024 | Yun | G06F 7/5443 |
| 2024/0112004 A1* | 4/2024 | An | G06N 3/04 |
| 2024/0135989 A1* | 4/2024 | Zhang | G11C 8/16 |

FOREIGN PATENT DOCUMENTS

TW    202143026 A    11/2021

OTHER PUBLICATIONS

In, et al.: "A Novel Voltage-Accumulation Vector-Matrix Multiplication Architecture Using Resistor-shunted Floating Gate Flash Memory Device for Low-power and High-density Neural Network Applications"; 978-1-7281-1987-8/18/$31.00 © 2018 IEEE; pp. 2.4.1-2.4.4.

* cited by examiner

*Primary Examiner* — Akm Zakaria
(74) *Attorney, Agent, or Firm* — McClure, Qualey & Rodack, LLP

(57) ABSTRACT

An in-memory computing (IMC) memory device and an IMC method are provided. The IMC memory device includes: a plurality of memory cells, the memory cells forming a plurality of computing layers; and a plurality of computing layer connectors, the computing layer connectors connecting between the computing layers. A first computing layer input is inputted into a first computing layer of the computing layers. The first computing layer generates a first computing layer output. A first computing layer connector of the computing layer connectors converts the first computing layer output into a second computing layer input. The first computing layer connector inputs the second computing layer input into a second computing layer of the computing layers. The computing layer connectors are a plurality of inverters, a plurality of voltage-to-voltage converters or a plurality of current-to-voltage converters.

8 Claims, 5 Drawing Sheets

IN MEMORY COMPUTING (IMC) MEMORY DEVICE AND METHOD

TECHNICAL FIELD

The disclosure relates in general to an in-memory computing (IMC) memory device and method.

BACKGROUND

In an in memory computing (IMC) architecture, a sum-of-current or a sum-of-voltage may be used to generate a sum-of-product computation result or a sum-of-logic operation computation result. However, this needs to convert the output current or the output voltage of the current computing layer into the input of the next computing layer.

Usually, an analog-t-digital converter (ADC) is used to convert the output current or the output voltage into a value for performing the activation operations. Then, the result is used as an input to the next computing layer.

But, the ADC is a high-cost component which has long processing time or large circuit area.

Therefore, there needs an IMC memory device and method which has short processing time and small circuit area.

SUMMARY

According to one embodiment, an in-memory computing (IMC) memory device is provided. The IMC memory device includes: a plurality of memory cells, the memory cells forming a plurality of computing layers; and a plurality of computing layer connectors, the computing layer connectors connecting between the computing layers. A first computing layer input is inputted into a first computing layer of the computing layers, the first computing layer generates a first computing layer output. A first computing layer connector of the computing layer connectors converts the first computing layer output into a second computing layer input, the first computing layer connector inputs the second computing layer input into a second computing layer of the computing layers. The computing layer connectors are a plurality of inverters, a plurality of voltage-to-voltage converters or a plurality of current-to-voltage converters.

According to another embodiment, an in-memory computing (IMC) method for an IMC memory device is provided. The IMC memory device includes a plurality of memory cells and a plurality of computing layer connectors, the memory cells forming a plurality of computing layers, the computing layer connectors connecting between the computing layers. The IMC method includes: inputting a first computing layer input into a first computing layer of the computing layers, the first computing layer generating a first computing layer output; and converting the first computing layer output into a second computing layer input by a first computing layer connector of the computing layer connectors, the first computing layer connector inputting the second computing layer input into a second computing layer of the computing layers, wherein the computing layer connectors are a plurality of inverters, a plurality of voltage-to-voltage converters or a plurality of current-to-voltage converters.

Figure 1:
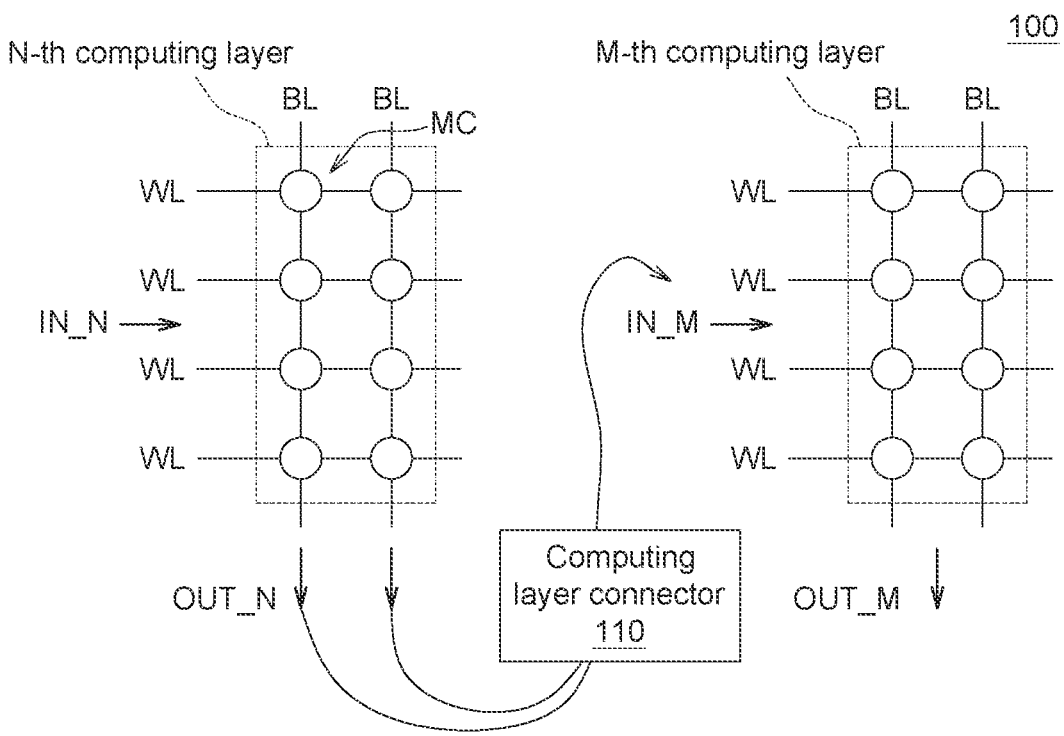
FIG. 1 shows an IMC memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows an IMC memory device according to one embodiment of the application. The IMC memory device 100 according to one embodiment of the application includes: a plurality of memory cells MC and a plurality of computing layer connectors 110. The memory cells MC form a plurality of computing layers. The computing layer connectors 110 connect between the computing layers. As shown in FIG. 1, the computing layer connector 110 is connected between the N-th computing layer and the M-th computing layer (N and M being positive integers). Each of the computing layers includes a plurality of memory cells MC, and the memory cells MC are at intersections of a plurality of bit lines BL and a plurality of word lines WL.

Taking the N-th computing layer as an example, the bit lines BL receive driving currents. The N-th computing layer input IN_N is inputted into the memory cells MC via the word lines WL. The N-th computing layer input IN_N may include a plurality of input voltages or a plurality of input currents. In the following, the N-th computing layer input IN_N including a plurality of input voltages is taken an example, but the application is not limited by this.

The N-th computing layer input IN_N controls the resistance of the memory cells MC of the N-th computing layer. For example but not limited by, when an input voltage of the N-th computing layer input IN_N is higher than a threshold voltage of the memory cell MC, the memory cell MC is turned on (having low resistance); and when an input voltage of the N-th computing layer input IN_N is lower than a threshold voltage of the memory cell MC, the memory cell MC is turned off (having high resistance).

The driving current is applied to the memory cell MC via the bit line BL. When the memory cell MC is turned on (having low resistance), the memory cell MC has a low voltage drop; and when the memory cell MC is turned off (having high resistance), the memory cell MC has a high voltage drop.

The N-th computing layer output OUT_N is a summation of all voltage drops of the memory cells MC. That is, the N-th computing layer output OUT_N is a sum-of-voltage which represents a sum-of-product computation result of the N-th computing layer input IN_N and the bit line driving currents.

In other possible embodiment of the application, the N-th computing layer output OUT_N may be a sum-of-current or a sum-of-resistance.

The computing layer connector 110 is for converting the N-th computing layer output OUT_N into the M-th computing layer input IN_M. In one embodiment of the application, the computing layer connector 110 is suitable for the voltage accumulation architecture, and the output of the CIM computation is a voltage value (i.e. the N-th computing layer output OUT_N is a voltage value). The computing layer connector 110 converts the N-th computing layer output OUT_N (having a voltage value) into the M-th computing layer input IN_M (also having a voltage value). In one embodiment of the application, the computing layer connector 110 is also suitable for a current accumulation architecture and the output of the CIM computation is a current value (i.e. the N-th computing layer output OUT_N is a current value). In the case that the output of the CIM computation is a voltage value (i.e. the N-th computing layer output OUT_N is a voltage value), a small-size current (for example but not limited by, a common-gate circuit or a current-to-voltage converter) is required for converting the current into a voltage output, and the computing layer connector 110 converts the N-th computing layer output OUT_N (having a voltage value) into the M-th computing layer input IN_M (also having a voltage value).

In one embodiment of the application, the memory cell MC converts the input (being a voltage value) into a voltage value or a current value; and each memory string (the same memory string is formed by the memory cells coupled to the same bit line BL) may collect the accumulated voltages or currents for generating a sum-of-product computation result or a sum-of-logic operation computation result.

Figure 2:
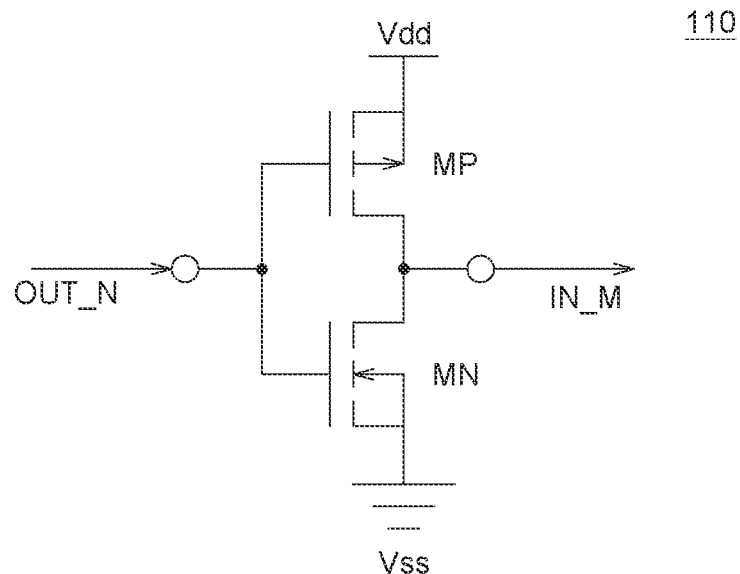
FIG. 2 shows a circuit structure of the computing layer connector according to one embodiment of the application.

FIG. 2 shows a circuit structure of the computing layer connector 110 according to one embodiment of the application. As shown in FIG. 2, the computing layer connector 110 is implemented by an inverter including: a first transistor MP and a second transistor MN, the first transistor MP being serially coupled to the second transistor MN. The first transistor MP and the second transistor MN have gates receiving the N-th computing layer output OUT_N; the first transistor MP and the second transistor MN have sources coupled to a first reference voltage source Vdd and a reference voltage source Vss, respectively; and the first transistor MP and the second transistor MN have drains outputting the M-th computing layer input IN_M.

The computing layer connector 110 implemented as the inverter may convert the N-th computing layer output OUT_N (being a voltage value) into the M-th computing layer input IN_M (being a voltage value).

In one embodiment of the application, the computing layer connector 110 may have other possible structures, for example but not limited by, a voltage-to-voltage converter or a current-to-voltage converter.

If the N-th computing layer output OUT_N is a current, then the N-th computing layer output OUT_N is converted into a voltage and inputted into the computing layer connector 110 implemented as the inverter.

From FIG. 2, the computing layer connector 110 implemented as the inverter may improve the data transfer efficiency between the current computing layer to the next computing layer, because the computing layer connector 110 implemented as the inverter has fast transfer efficiency.

In one embodiment of the application, the computing layer connector 110 implemented as the inverter has a device driving ratio "mp:mn" which is tunable to change the switching threshold voltage position of the computing layer connector 110, wherein "mp" and "mn" is the channel width-length ratio of the first transistor MP and the second transistor MN.

In one embodiment of the application, the first reference voltage source Vdd and/or the second reference voltage source Vss may change the high level and/or the low level of the M-th computing layer input IN_M of the computing layer connector 110.

Further, in other possible embodiments of the application, different inverter structures may be used to implement the computing layer connector 110 which is still within the spirit and the scope of the application.

Figure 3A:
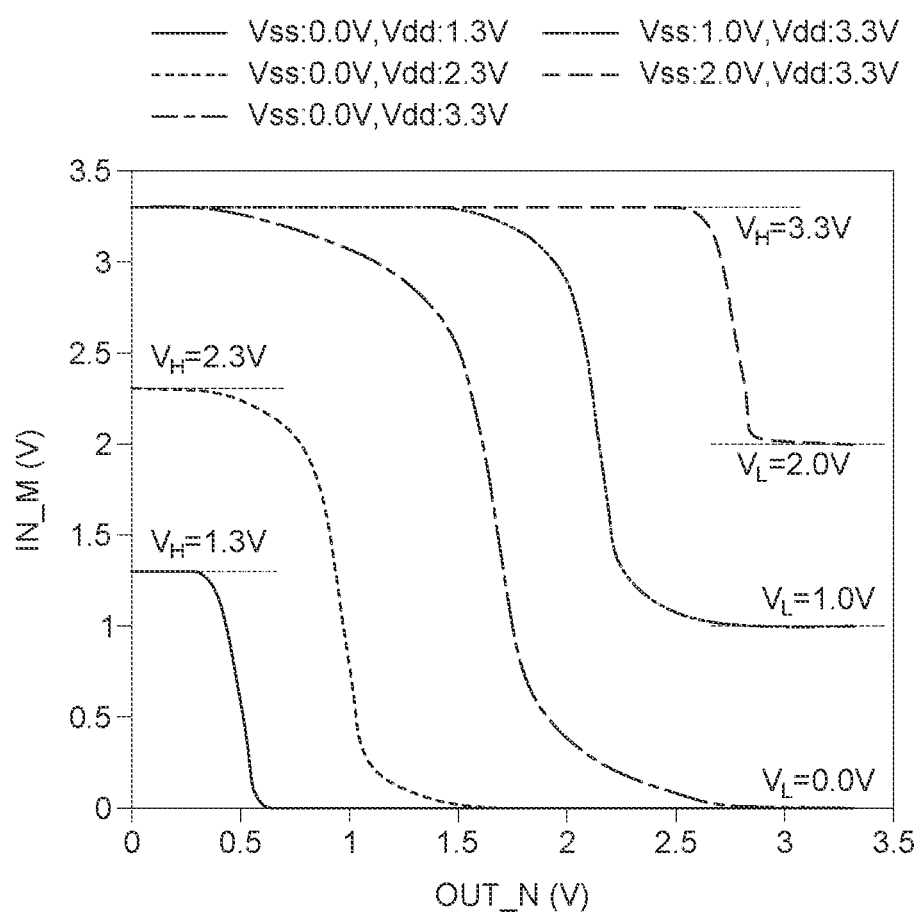
FIG. 3A to FIG. 3C show electronic characteristics of the computing layer connector of the embodiment of the application.
Figure 3B:
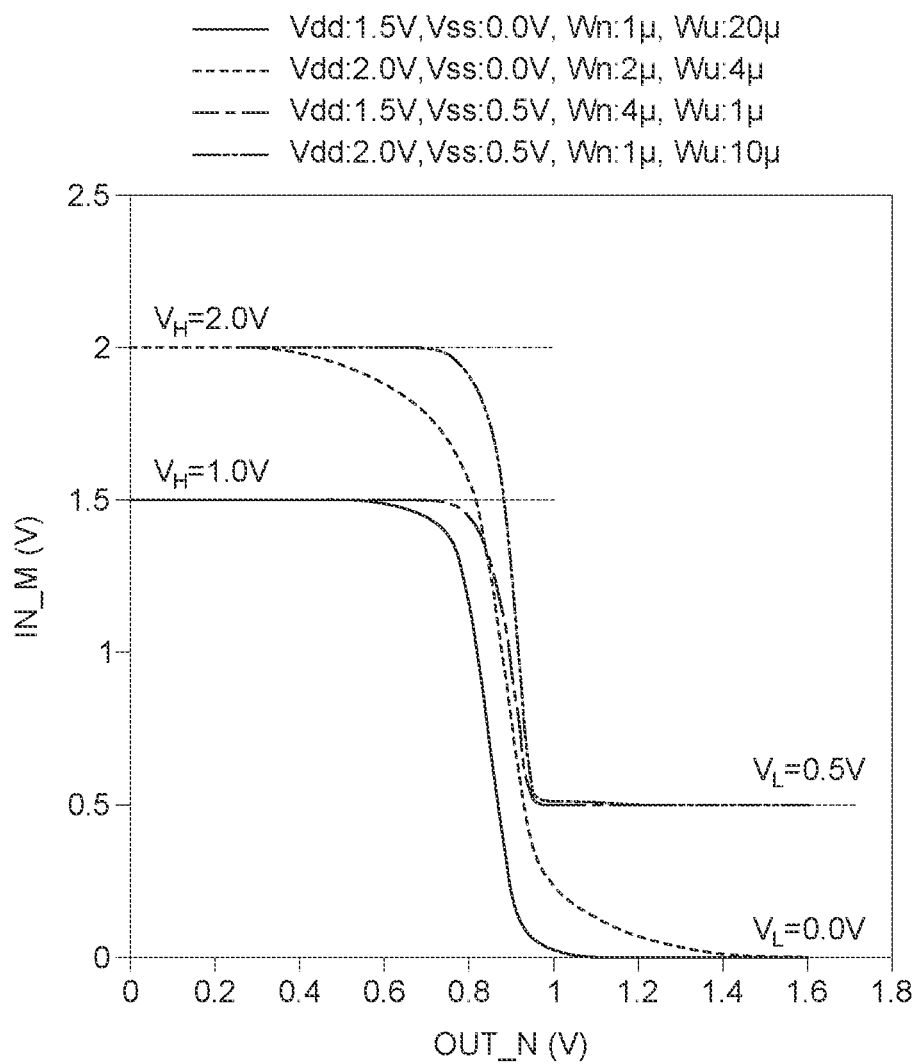
Figure 3C:
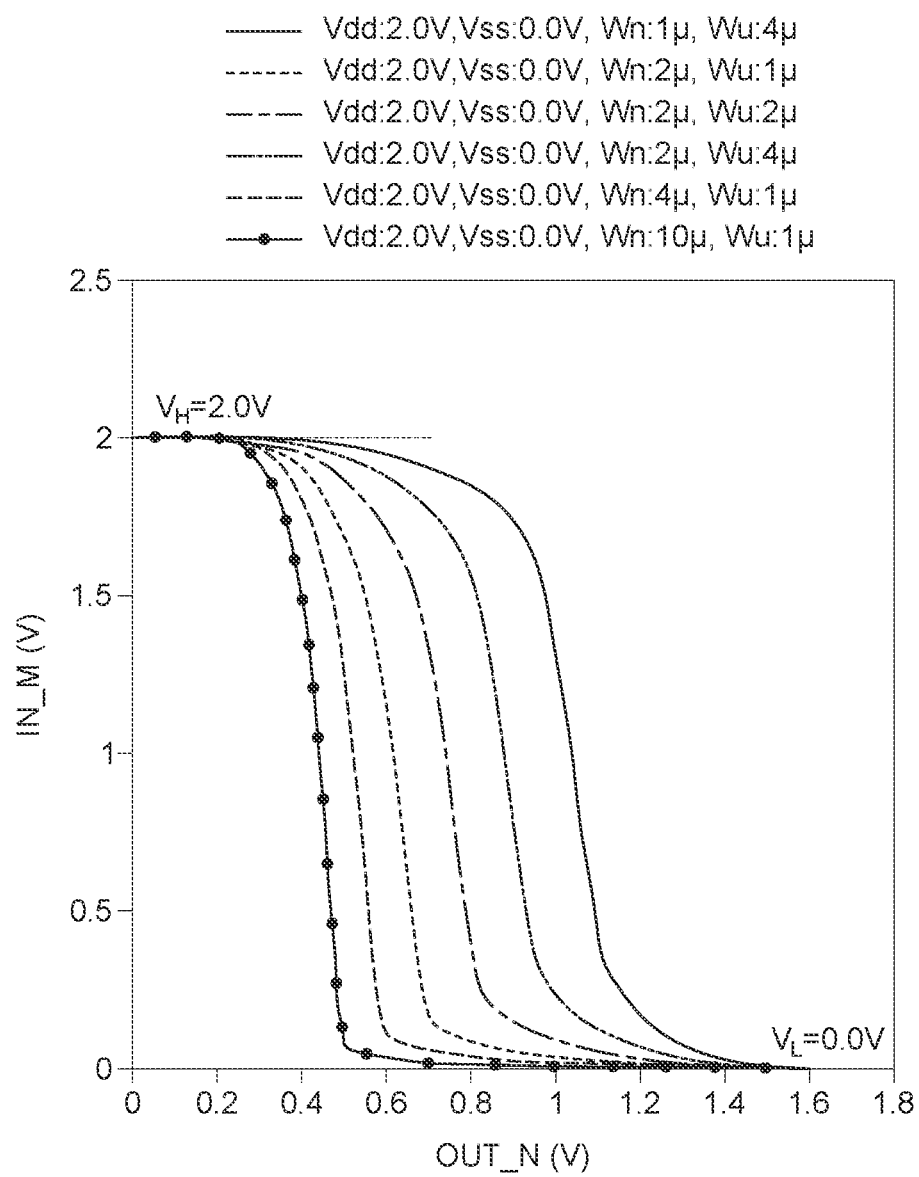

FIG. 3A to FIG. 3C show electronic characteristics of the computing layer connector 110 of the embodiment of the application. The computing layer connector 110 being implemented as an inverter is taken as an example to describe that (1) changing the device driving ratio "mp:mn" of the computing layer connector 110 changes the switching threshold voltage position of the computing layer connector 110 and/or (2) changing the first reference voltage source Vdd and/or the second reference voltage source Vss changes the high level and/or the low level of the M-th computing layer input IN_M of the computing layer connector 110. In FIG. 3A to FIG. 3C, "VH" and "VL" refer to the high level and the low level of the M-th computing layer input IN_M.

In FIG. 3A, the first reference voltage source Vdd, the second reference voltage source Vss, the high level VH and the low level VL are: (1) Vss=0.0V, Vdd:1.3V, VH=1.3V, VL=0.0V; (2) Vss=0.0V, Vdd:2.3V, VH=2.3V, VL=0.0V; (3) Vss=0.0V, Vdd:3.3V, VH=3.3V, VL=0.0V; (4) Vss=1.0V, Vdd:3.3V, VH=3.3V, VL=1.0V; (5) Vss=2.0V, Vdd:3.3V, VH=3.3V, VL=2.0V.

In FIG. 3A, in the case that Vss=0.0V, Vdd:2.3V, when the N-th computing layer output OUT_N is lower than 0.5V, the M-th computing layer input IN_M is the high level VH (=2.3V); and when the N-th computing layer output OUT_N is higher than 1.5V, the M-th computing layer input IN_M is the low VL (=0.0V). Others are so on.

From FIG. 3A, changing the first reference voltage source Vdd and/or the second reference voltage source Vss may change the high level and/or the low level of the M-th computing layer input IN_M of the computing layer connector 110.

In FIG. 3B, the first reference voltage source Vdd, the second reference voltage source Vss, the channel width Wn of the second transistor MN, the channel width Wp of the first transistor MP, the high level VH and the low level VL are: (1) Vdd=1.5V, Vss:0.0V, Wn=1 μ, Wp=20 μ, VH=1.5V, VL=0.0V; (2) Vdd=2.0V, Vss:0.0V, Wn=2 μ, Wp=4 μ, VH=2.0V, VL=0.0V; (3) Vdd=1.5V, Vss:0.5V, Wn=4 μ, Wp=1 μ, VH=1.5V, VL=0.5V; (4) Vdd=2.0V, Vss:0.5V, Wn=1 μ, Wp=10 μ, VH=2.0V, VL=0.5V.

From FIG. 3B, by changing the device driving ratio "mp:mn" of the computing layer connector 110 implemented as the inverter, the switching threshold voltage position of the computing layer connector 110 is finely tuned.

In FIG. 3C, the first reference voltage source Vdd, the second reference voltage source Vss, the channel width Wn of the second transistor MN, the channel width Wp of the first transistor MP, the high level VH and the low level VL are: (1) Vdd=2.0V, Vss:0.0V, Wn=1 μ, Wp=4 μ, VH=2.0V, VL=0.0V; (2) Vdd=2.0V, Vss:0.0V, Wn=2 μ, Wp=1 μ, VH=2.0V, VL=0.0V; (3) Vdd=2.0V, Vss:0.0V, Wn=2 μ, Wp=2 μ, VH=2.0V, VL=0.0V; (4) Vdd=2.0V, Vss:0.0V, Wn=2 μ, Wp=4 μ, VH=2.0V, VL=0.0V; (5) Vdd=2.0V, Vss:0.0V, Wn=4 μ, Wp=1 μ, VH=2.0V, VL=0.0V; (6) Vdd=2.0V, Vss:0.0V, Wn=10 μ, Wp=1 μ, VH=2.0V, VL=0.0V.

From FIG. 3C, by changing the device driving ratio "mp:mn" of the computing layer connector 110 implemented as the inverter, the switching threshold voltage position of the computing layer connector 110 is finely tuned.

Figure 4:
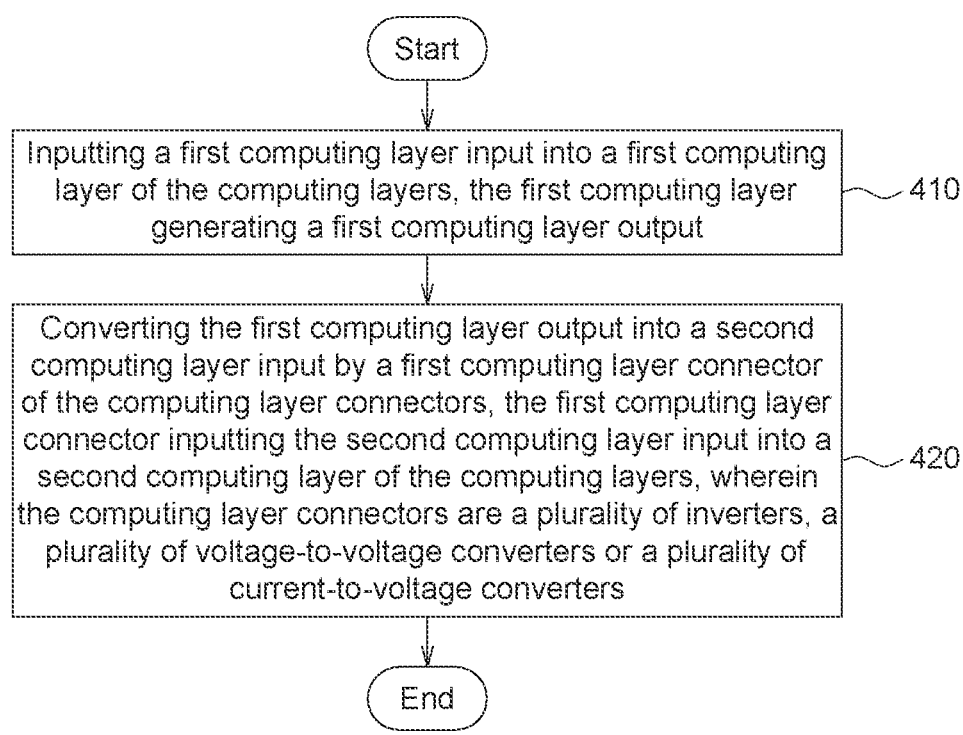
FIG. 4 shows the IMC method according to one embodiment of the application.

FIG. 4 shows the IMC method according to one embodiment of the application. The IMC method according to one embodiment of the application includes: (410) inputting a first computing layer input into a first computing layer of the computing layers, the first computing layer generating a first computing layer output; and (420) converting the first computing layer output into a second computing layer input by a first computing layer connector of the computing layer connectors, the first computing layer connector inputting the second computing layer input into a second computing layer of the computing layers, wherein the computing layer connectors are a plurality of inverters, a plurality of voltage-to-voltage converters or a plurality of current-to-voltage converters.

The IMC memory device and the IMC method according one embodiment of the application are applicable in various fields, for example but not limited by, neural network computation, vector-matrix multiplication operations and so on.

Compared with the prior art using high-cost ADC having long processing time and large circuit area, in one embodiment of the application, the computing layer connector 110 may improve the data transfer efficiency between the current computing layer to the next computing layer because the computing layer connector 110 has fast data conversion rate. Further, in one embodiment of the application, the computing layer connector 110 implemented as the inverter has a small circuit area.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An in-memory computing (IMC) memory device including:
   a plurality of memory cells, the memory cells forming a plurality of computing layers; and
   a plurality of computing layer connectors, the computing layer connectors connecting between the computing layers,
   wherein,
   a first computing layer input is inputted into a first computing layer of the computing layers, the first computing layer generates a first computing layer output,
   a first computing layer connector of the computing layer connectors converts the first computing layer output into a second computing layer input, the first computing layer connector inputs the second computing layer input into a second computing layer of the computing layers, and
   the computing layer connectors are a plurality of inverters,
   wherein the first computing layer connector is one inverter among the plurality of inverters, the first computing layer connector includes a first transistor and a second transistor, control terminals of the first and the second transistors receive the first computing layer output, first terminals of the first and the second transistor generate the second computing layer input, a device driving ratio of the first and the second transistors of the first computing layer connector is adjusted to change a switching threshold voltage position of the first computing layer connector,
   the first computing layer input controls resistance of the memory cells of the first computing layer;
   a plurality of driving currents are applied to the memory cells of the first computing layer via a plurality of bit lines; and
   the first computing layer output is a computation result of the plurality of driving currents with voltage drops of the memory cells of the first computing layer.

2. The IMC memory device according to claim 1, wherein the first computing layer output is a sum-of-voltage, a sum-of-current or a sum-of-resistance.

3. The IMC memory device according to claim 1, wherein the first computing layer output is a current value or a voltage value.

4. The IMC memory device according to claim 1, wherein a first reference voltage source and/or a second reference voltage source of the first and the second transistors of the first computing layer connector is adjusted to change a first level and/or a second level of the second computing layer input.

5. An in-memory computing (IMC) method for an IMC memory device including a plurality of memory cells and a plurality of computing layer connectors, the memory cells forming a plurality of computing layers, the computing layer connectors connecting between the computing layers, the IMC method including:
   inputting a first computing layer input into a first computing layer of the computing layers, the first computing layer generating a first computing layer output, and converting the first computing layer output into a second computing layer input by a first computing layer connector of the computing layer connectors, the first computing layer connector inputting the second computing layer input into a second computing layer of the computing layers,
   wherein the computing layer connectors are a plurality of inverters,
   wherein the first computing layer connector is one inverter among the plurality of inverters, the first computing layer connector includes a first transistor and a second transistor, control terminals of the first and the second transistors receive the first computing layer output, first terminals of the first and the second transistor generate the second computing layer input, a device driving ratio of the first and the second transistors of the first computing layer connector is adjusted to change a switching threshold voltage position of the first computing layer connector,
   the first computing layer input controls resistance of the memory cells of the first computing layer;
   a plurality of driving currents are applied to the memory cells of the first computing layer via a plurality of bit lines; and
   the first computing layer output is a computation result of the plurality of driving currents with voltage drops of the memory cells of the first computing layer.

6. The IMC method according to claim 5, wherein the first computing layer output is a sum-of-voltage, a sum-of-current or a sum-of-resistance.

7. The IMC method according to claim 5, wherein the first computing layer output is a current value or a voltage value.

8. The IMC method according to claim 5, wherein a first reference voltage source and/or a second reference voltage source of the first and the second transistors of the first computing layer connector is adjusted to change a first level and/or a second level of the second computing layer input.

* * * * *